United States Patent
Wallace (10) Patent No.: US 7,138,583 B2
(45) Date of Patent: Nov. 21, 2006

(54) METHOD AND APPARATUS FOR MAINTAINING A SEPARATION BETWEEN CONTACTS

(75) Inventor: Robert F. Wallace, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 481 days.

(21) Appl. No.: 10/142,213

(22) Filed: May 8, 2002

(65) Prior Publication Data

US 2005/0000727 A1    Jan. 6, 2005

(51) Int. Cl.
*H05K 7/06*    (2006.01)
*H01L 23/488*    (2006.01)

(52) U.S. Cl. .................. 174/260; 257/737; 257/778; 438/108; 438/613; 29/840; 228/180.22

(58) Field of Classification Search ............. 257/737, 257/778
See application file for complete search history.

(56) References Cited

U.S. PATENT DOCUMENTS

| | | | | |
|---|---|---|---|---|
| 3,373,481 | A * | 3/1968 | Lins et al. ................. 228/175 |
| 5,633,204 | A * | 5/1997 | Tago et al. ................. 438/614 |
| 5,640,051 | A * | 6/1997 | Tomura et al. .............. 257/778 |
| 5,640,052 | A * | 6/1997 | Tsukamoto ................. 257/781 |
| 5,767,580 | A |   | 6/1998 | Rostoker .................... 257/737 |
| 5,852,871 | A |   | 12/1998 | Khandros ................... 29/843 |
| 5,874,780 | A * | 2/1999 | Murakami .................. 257/775 |
| 5,889,326 | A * | 3/1999 | Tanaka ..................... 257/737 |
| 6,100,597 | A * | 8/2000 | Nakamura .................. 257/787 |
| 6,142,823 | A |   | 11/2000 | Ishibashi ................... 438/500 |
| 6,163,463 | A |   | 12/2000 | Marrs ....................... 361/773 |
| 6,177,730 | B1 * | 1/2001 | Kira et al. ................. 257/778 |
| 6,215,670 | B1 |   | 4/2001 | Khandros ................... 361/774 |
| 6,229,711 | B1 * | 5/2001 | Yoneda ..................... 361/760 |
| 6,281,581 | B1 |   | 8/2001 | Desai et al. |
| 6,348,739 | B1 * | 2/2002 | Taguchi et al. ............. 257/778 |
| 6,414,849 | B1 * | 7/2002 | Chiu ........................ 361/760 |
| 6,448,665 | B1 * | 9/2002 | Nakazawa et al. .......... 257/789 |
| 6,469,394 | B1 * | 10/2002 | Wong et al. ............... 257/780 |
| 6,624,457 | B1 * | 9/2003 | Li et al. ................... 257/295 |
| 6,798,072 | B1 * | 9/2004 | Kajiwara et al. ........... 257/778 |
| 2002/0008966 | A1 * | 1/2002 | Fjelstad et al. ............ 361/760 |
| 2003/0101584 | A1 * | 6/2003 | Matsumura ................ 29/840 |

FOREIGN PATENT DOCUMENTS

EP    1133014 A2    9/2001

OTHER PUBLICATIONS

European Patent Office "Communication Pursuant to Article 96(2) EPC", mailed in European Application No. 03 252 892.9-1528 on Mar. 1, 2005, 4 pages.
European Patent Office "Communication to Article 96(2) EPC", mailed in European Application No. 03 252 892.9-1528 on Nov. 15, 2005, 3 pages.

* cited by examiner

*Primary Examiner*—John B. Vigushin
(74) *Attorney, Agent, or Firm*—Parsons Hsue & de Runtz LLP (57) ABSTRACT

Methods and apparatus for controlling the distance between contact pads or leads which are to be interfaced are disclosed. According to one aspect of the present invention, an electrical package includes a body and a contact. The body includes electrical circuitry such as traces. The contact is arranged on the body, and includes a contact body and a contact feature. The contact feature is a protrusion which substantially extends from the contact body, and is arranged to come into contact with an external surface. In one embodiment, the external surface is an external contact, and the contact feature is arranged to substantially space the contact body away from the external contact.

5 Claims, 8 Drawing Sheets

METHOD AND APPARATUS FOR MAINTAINING A SEPARATION BETWEEN CONTACTS

BACKGROUND OF THE INVENTION

1. Field of Invention

The present invention relates generally to the formation of devices which include circuit boards and components which are to be coupled to the circuit boards. More particularly, the present invention relates to systems and methods for improving the consistency of connections between contacts on a circuit board and contacts on a component that is interfaced with the circuit board.

2. Description of the Related Art

Figure 1:
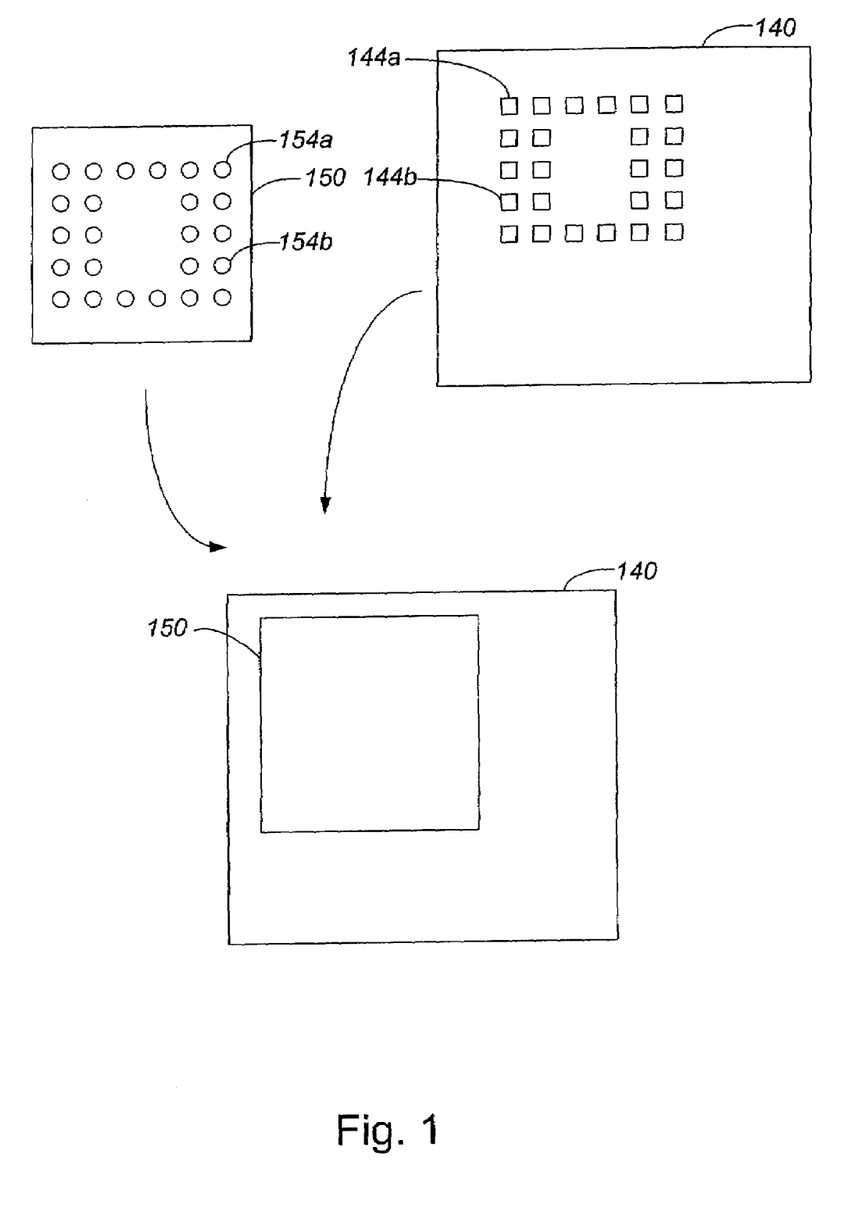
FIG. 1 is a representation of a circuit board and a semiconductor package which are arranged to make electrical contact through contract pads.

Many devices, e.g., non-volatile memory systems such as flash memory cards, include printed circuit boards on which various electronic components may be soldered. Such circuit boards generally allow interconnections to be made between the components, e.g., semiconductor packages and input/output connectors. Typically, such interconnections may be made through electrical contact pads which are present on both circuit boards and components. FIG. 1 is a representation of a circuit board and a semiconductor package which are arranged to make electrical contact through contract pads. A circuit board 140 includes a pattern or an array of contact pads 144 which are generally covered with, e.g., "printed" with, solder paste. Contact pads 144 are coupled to electronic circuitry or traces on circuit board 144. A semiconductor package 150 includes a pattern or an array of contact pads 154 which are often plated with gold or a similar material. Like contact pads 144, contact pads 154 are typically coupled to circuitry or traces associated with semiconductor package 150. Both contact pads 144 and contact pads 154 are arranged to enable signals to be read from or provided to circuit board 140 and semiconductor package 150, respectively.

When semiconductor package 150 is to be soldered to circuit board 140, contact pads 154 may be aligned with contact pads 144. The aligning of contact pads 154 with contact pads 144 is possible when the pattern and the spacing associated with contact pads 154 matches the pattern and the spacing of contact pads 144 of the circuit board 140. Once contact pads 154 and contact pads 144 are aligned, the solder paste on contact pads 144 may be heated, and electrical connections may be made between contact pads 154 and contact pads 144 when the solder paste effectively bonds contact pads 154 to corresponding contact pads 144. That is, contact pads 154 are aligned with contact pads 144 and soldered such that contact pad 154a is in electrical contact with contact pad 144a, and contact pad 154b is in electrical contact with contact pad 144b.

Figure 2A:
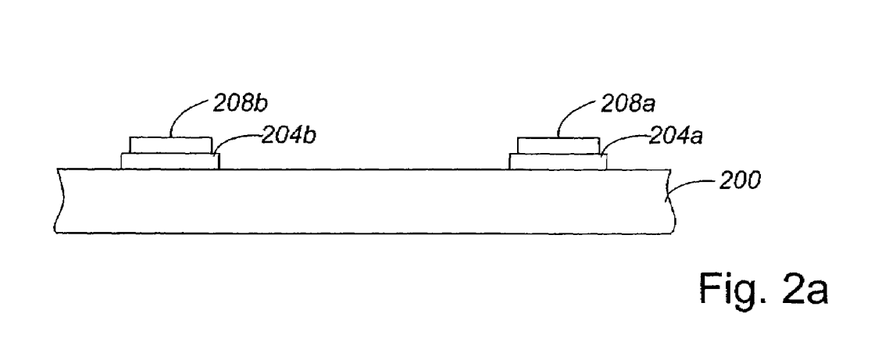
FIG. 2*a* is a diagrammatic side-view representation of a circuit board with contact pads.

In general, as described above, contact pads 154 are substantially coated or printed with solder paste. FIG. 2a is a diagrammatic side-view representation of a circuit board or a substrate with contact pads. A circuit board 200 is formed to include pads 204 on at least a top surface of circuit board 200. For ease of illustration, features such as various layers and interconnects associated with circuit board 200 have not been shown. Each pad 204 on circuit board 200 typically includes a layer of solder paste 208, as previously mentioned.

Figure 2B:
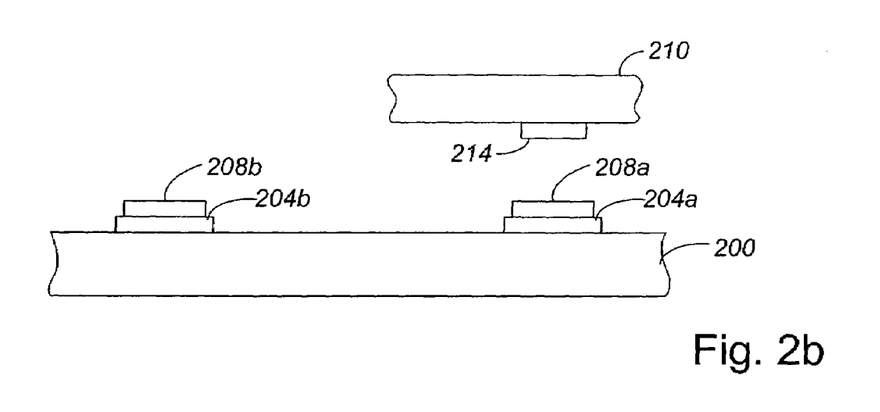
FIG. 2*b* is a diagrammatic side-view representation of a circuit board, e.g., circuit board 200 of FIG. 2*a*, with a component that is to be interfaced to the circuit board.
Figure 2C:
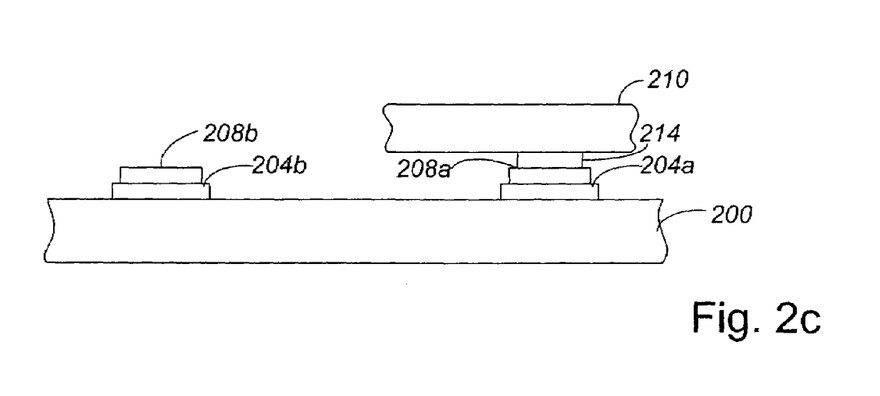
FIG. 2*c* is a diagrammatic side-view representation of a component, e.g., component 210 of FIG. 2*a*, that is interfaced with a circuit board, e.g., circuit board 200 of FIG. 2*a*.

When a component with a contact pad, e.g., component 210 with contact pad 214 as shown in FIG. 2b, is to be electrically coupled to circuit board 200, component 210 is positioned over circuit board 200 such that pad 214 is effectively lined up with an appropriate pad 204, e.g., pad 204a. Once pad 214 is properly aligned with pad 204a, pad 214 may be brought into contact with solder paste layer 208a, as shown in FIG. 2c. When solder paste layer 208a is heated, an electrical coupling may be achieved between pad 214 and pad 204a through solder paste layer 208a.

The thickness of solder paste layer 208 is relatively difficult to control once solder paste has been heated to effectively bond pads 204, 214. In particular, when there are multiple pads 204, 214 which are to be interfaced, controlling the thickness of solder paste layer 208, e.g., the thickness of the spacing between pad 214 and pad 204a, may be difficult. Typically, reliability issues associated with the performance of circuit board 200 may arise when the spacing between pads 204, 214 is not carefully controlled.

Figure 2D:
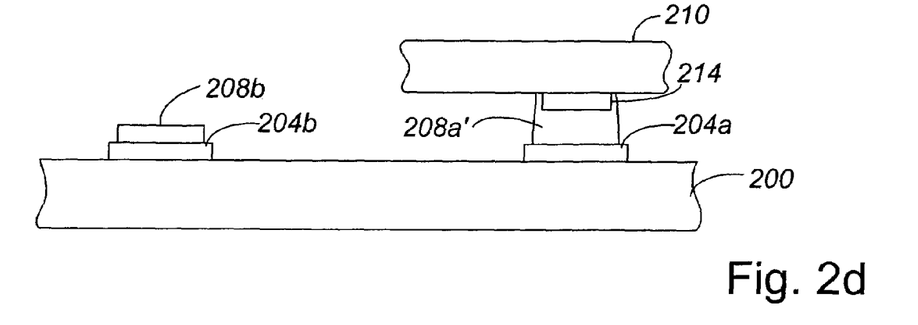
FIG. 2*d* is a diagrammatic side-view representation of a circuit board and a component, e.g., circuit board 200 and component 210, when the spacing between contact pads of the circuit board and the component is relatively large.

FIG. 2d is a diagrammatic side-view representation of circuit board 200 and component 210 when the spacing between contact pads 204, 214 is relatively large. When pad 214 is spaced too far from pad 204a, solder paste layer 208a' may be relatively thick, but less dense. As a result, the "joint" formed by solder paste layer 208a' may crack, thereby compromising the electrical connectivity between pad 214 and pad 204a. While the electrical connectivity between pad 214 and pad 204a may not be compromised by the relatively large thickness of solder paste layer 208a', the integrity of connections between other pads (not shown) on component 210 and pads 204 may be compromised. For example, the spacing between some pads or pins of component 210 and pads 204 may be such that some pads are effectively "open." In other words, when the spacing between pads of component 210 and pads 204 is too great, then a solder paste layer 208 may not be able to successfully bridge the distance between pads of component 210 and pads 204. As such, there may either be no connection or an inconsistent connection between pads of component 210 and pads 204.

Figure 2E:
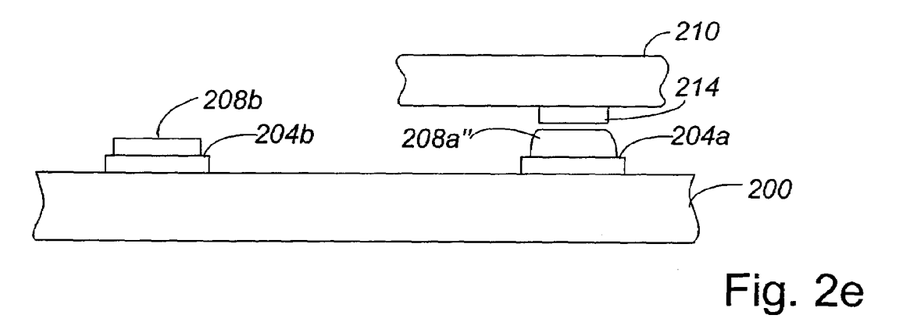
FIG. 2*e* is a diagrammatic side-view representation of a circuit board and a component, e.g., circuit board 200 and component 210, when contact pads of the circuit board and the component are effectively not joined.

FIG. 2e is a diagrammatic side-view representation of circuit board 200 and component 210 when the spacing between contact pads 204a, 214 is such that solder paste layer 208a does not effectively join contact pads 204a, 214. When contact pad 214 is spaced too far apart from contact pad 204a, solder paste layer 208a'' may be ineffective for bridging the distance between contact pads 204a, 214. As such, there may be no electrical contact of pads 204a, 214 through solder paste layer 208a''. Specifically, when the distance between contact pads 204a, 214 is too great, then open contacts may occur, i.e., there may effectively be no electrical connectivity between pads 204a, 214.

Figure 2F:
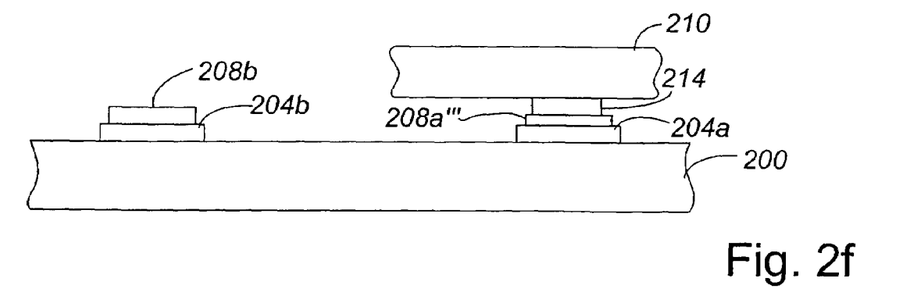
FIG. 2*f* is a diagrammatic side-view representation of a circuit board and a component, e.g., circuit board 200 and component 210, when the spacing between contact pads of the circuit board and the component is relatively small.

While spacing pad 204a too far apart from pad 214 to the extent that solder paste layer 208a is thicker than desired or forms an incomplete joint may be undesirable, spacing pad 204a too close to pad 214 may also be undesirable. As shown in FIG. 2f, a solder paste layer 208a''' may for a relatively thin connection between pad 204a and pad 214. When solder paste layer 208a''' is too thin, the strength of the joint formed by solder paste layer 208a''' may be relatively weak. In other words, when the thickness of solder paste layer 208a''' relatively small, although electrical connectivity between pad 204a and pad 214 may be achieved, the strength of the connection may be compromised. By way of example, when the thickness of solder paste layer 208a''' between pad 204a and pad 214 is approximately zero millimeters, there is substantially no strength in the joint created by solder paste layer 208a'''.

Maintaining consistency between connections formed between various pads, leads, or contacts of a circuit board and components of the circuit board is often difficult because controlling the thickness of the space between two pads which are to be electrically connected is not an easy task. Even when the space between two particular pads is acceptable, the space between two other pads may be unacceptable, as it is difficult to maintain a consistent spacing between each pad of a component and corresponding pads of a circuit board within an assembly. Any failure to create and to maintain a desired amount of space between pads and, hence, a consistent thickness of solder paste material intended to fill the space, often compromises the overall integrity of any device which includes the assembly The reliability of connections formed between pads, leads, or contacts of a circuit board and components of the circuit board is important to ensure that a device which includes the circuit board may meet performance standards. When connections are not reliable, signals that are to be passed through the connections may not be successfully routed. As discussed above, unreliable connections or bridges between pads may include open connections and weak connections. The presence of even a single unreliable connection within a device may greatly affect the performance of the device.

Therefore, what is needed is a method and an apparatus for improving the integrity of connections between a circuit board and components of the circuit board. That is, what is desired is a method and a system which enables the thickness of a solder paste layer which bonds pads of a component with pads of a circuit board to effectively be controlled.

SUMMARY OF THE INVENTION

The present invention relates to a system and a method for controlling the distance between contact pads or leads which are to be interfaced. According to one aspect of the present invention, an electrical package includes a body and a contact. The body includes electrical circuitry such as traces. The contact is arranged on the body, and includes a contact body and a contact feature. The contact feature is a protrusion which substantially extends from the contact body, and is arranged to come into contact with an external surface. In one embodiment, the external surface is an external contact, and the contact feature is arranged to substantially space the contact body away from the external contact.

In another embodiment, the contact body has a first surface area and the contact feature includes a contact surface that has a second surface area. The contact surface contacts the external surface, and is more than approximately twenty times smaller than the first surface area. In still another embodiment, e contact body and the contact feature are electrically coupled.

The use of a contact pad which includes two substantially integral parts such as a body and a spacer feature allows the distance between the contact pad and another contact pad which is to be interfaced with or bonded with the contact pad to be controlled. The spacer feature on one contact pad comes into contact with the other contact pad, and provides an offset between the body of the contact pad and the other contact pad. Since the magnitude of the offset may be controlled by the height of the spacer feature, the thickness of a solder joint formed to include the two contact pads may be controlled. As such, the thickness of a solder layer between the body of one contact pad and the other contact pad may effectively be prevented from being either too thin or too thick. When the thickness of the solder layer is too thin, the strength of the bond formed by the solder layer may be adversely affected. Alternatively, if the solder layer is too thick, then open connections may result in an overall assembly which includes the solder layer and the contact pads. Therefore, preventing the thickness of the solder layer from being either too thin or too thick increases the reliability of the overall assembly which includes the contact pads.

According to another aspect of the present invention, an assembly includes a first package and a second package. The first package includes a first electrical contact that has a contact surface. A second electrical contact, which has a body portion and a spacer portion, is included in the second package. The spacer portion is arranged to interface with the contact surface of the first electrical contact to define a distance between the contact surface of the first electrical contact and the body portion of the second electrical contact. In one embodiment, the assembly also includes a layer of solder material that couples the first electrical contact to the second electrical contact. Such a layer of solder material is arranged between the contact surface of the first electrical contact and the body portion of the second electrical contact.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

When connections or joints formed between contact pads or leads of a printed circuit board and components of the circuit board are not reliable, an overall device which includes the printed circuit board may be relatively unreliable, and may not meet performance standards. If connections are not reliable, then signals may not be successfully passed between the printed circuit board and components of the printed circuit board. Unreliable connections or bridges between pads of a component and pads of a printed circuit board may occur if the pads are spaced too far apart when the pads are to be soldered together, which potentially results in open connections. An unreliable connection may also occur if the space between a pad of a component and a pad of a printed circuit board is too small when the pads are to be soldered together, as the strength of such a connection may be relatively weak. The presence of even a single unreliable connection within a device may have a significant adverse effect on the performance of the device.

The use of a spacer between a pad of a substrate, e.g., a component, and a pad of another substrate, e.g., a printed circuit board or another component, may allow the thickness of a layer of solder material between the pads to effectively be controlled, as the thickness of the layer of solder material may be substantially defined by the height of the spacer. When the surface area of the spacer that contacts the pad of the printed circuit board is relatively small, then the strength of the solder joint connection between the pad of the component and the pad of the printed circuit board is not significantly compromised while the likelihood of an occurrence of an open connection is reduced. Typically, a spacer is incorporated as a feature of an overall contact pad such that when the overall contact pad is formed, e.g., through a chemical etching process or a stamping process, the spacer is formed as apart of the overall contact pad.

Figure 3:
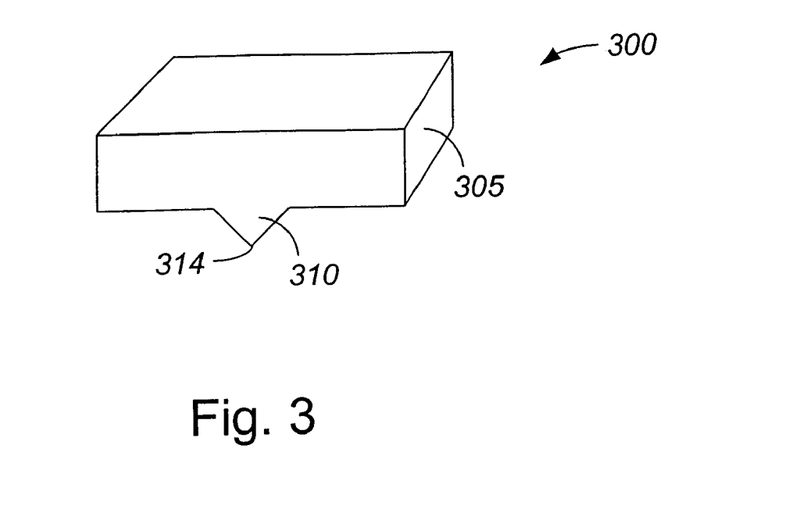
FIG. 3 is a diagrammatic representation of a contact pad with a spacer feature in accordance with a first embodiment of the present invention.

FIG. 3 is a diagrammatic representation of a contact pad with a spacer feature in accordance with an embodiment of the present invention. A contact pad 300 may be formed from a contact material such as copper, nickel, or similar metals, and plated, e.g., with gold, nickel, tin, lead, or other solder materials. Contact pad 300 includes a pad portion 305 and a spacer feature 310 that is coupled to pad portion 305.

Typically, pad portion 305 and spacer feature 310 are formed as a substantially single piece during an etching process or a stamping process. Spacer feature 310 may have substantially any suitable shape, e.g., topology or cross-section. As shown, spacer feature 310 has an approximately triangular cross-section, and effectively serves as a tip that protrudes from pad portion 305. In one embodiment, spacer feature 310 may be relatively rigid.

In general, contact pad 300 is arranged to be included in a component such as a semiconductor package that is to be soldered to a printed circuit board or, more specifically, a contact pad on the circuit board. Spacer feature 310 is arranged to contact a contact pad of a circuit board, as will be described below with respect to FIG. 4, when contact pad 300 is effectively soldered to the contact pad of the circuit board. The portion of spacer feature 310 that is arranged to come into contact with a contact pad on a circuit board is a contact area 314. In one embodiment, contact area 314 may be arranged to effectively provide a contact point.

The dimensions of contact area 314 and, more generally, spacer feature 310, may vary widely based on a variety of different factors. By way of example, the dimensions of contact area 314 may depend upon the overall size of contact pad 300. Typically, the dimensions of contact area 314 are selected such that contact area 314 is a relatively small percentage, e.g., less than approximately five percent, of an overall area associated with pad portion 305. When contact area 314 is relatively small compared to a surface area of pad portion 305, or an area of pad portion 305 that is to come into contact with solder material, a joint created between contact pad 300 and a corresponding contact pad on a circuit board may be less likely to crack. That is, the strength of a joint may be less likely to be compromised. The dimensions of spacer feature 310, e.g., the height of spacer feature 310, is typically selected such that a desired thickness of a solder material layer may be achieved, as will be discussed below with reference to FIG. 5.

Figure 4:
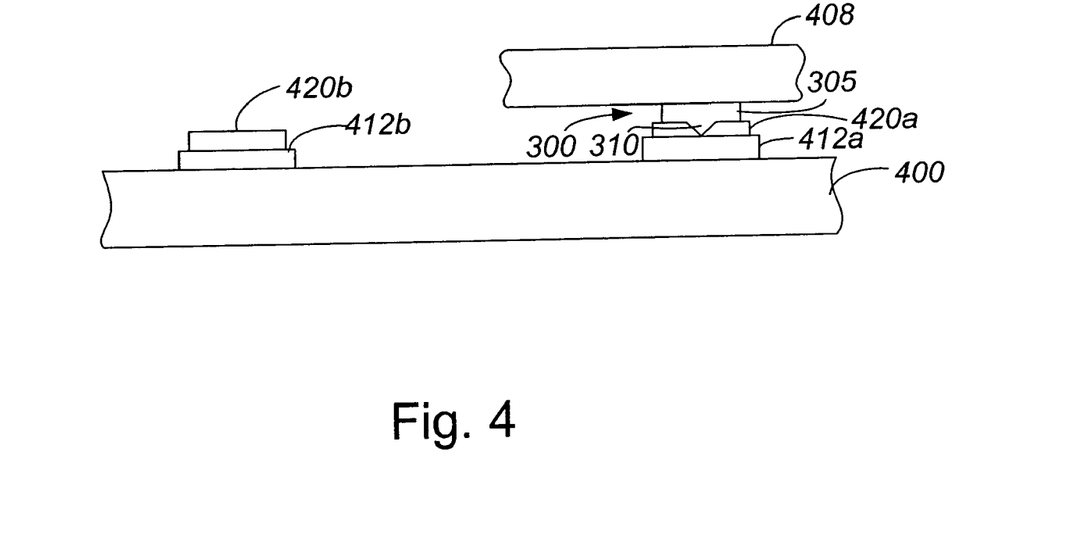
FIG. 4 is a diagrammatic side-view representation of a component, which includes a pad with a spacer feature, that is interfaced with a circuit board in accordance with an embodiment of the present invention.

Although contact pad 300 may be part of substantially any circuit board or component, contact pad 300 is typically part of a semiconductor package which is to be soldered to pads on the surface of a circuit board. Specifically, contact pad 300 may be soldered to a corresponding pad, which is printed with solder paste, on the surface of a circuit board. FIG. 4 is a diagrammatic side-view representation of a component, which includes a pad with a spacer feature, i.e., contact pad 300 of FIG. 3, that is soldered to a pad on the surface of a circuit board in accordance with an embodiment of the present invention. Contact pad 300, which includes spacer feature 310, is an electrical lead or contact pad that is associated with a body of a component 408, e.g., a semiconductor package. Typically, contact pad 300 is in electrical communication with electrical circuitry and traces (not shown) that are contained within the body of component 408. Spacer feature 310 is effectively a protrusion on contact pad 300 that enables a distance, e.g., a thickness of a solder layer 420a, between a contact pad 412a of a circuit board 400 to be substantially controlled. Specifically, spacer feature 310 prevents the thickness of solder layer 420a both from being too thin and from being too thick by effectively defining a distance between contact pad 412a and pad portion 305. The thickness of solder layer 420a when solder layer 420a is used to create a joint substantially between contact pad 300 and contact pad 412a is approximately equivalent to a height of spacer feature 310.

Figure 5:
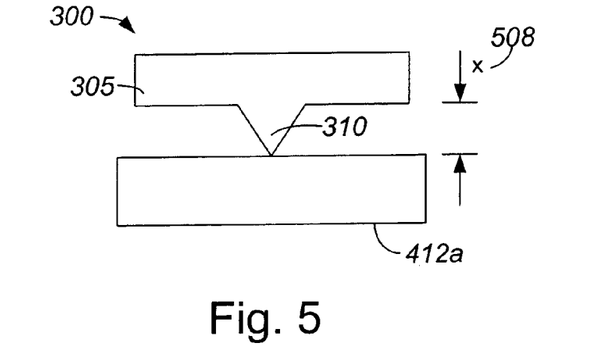
FIG. 5 is a diagrammatic representation of a pad with a spacer feature that is in contact with a pad without a spacer feature in accordance with an embodiment of the present invention.

With reference to FIG. 5, the selection of a height of a spacer feature, e.g., spacer feature 310 of FIG. 3, will be described in accordance with an embodiment of the present invention. A height 'x' 508 is a height of spacer feature 310. In the described embodiment, when contact pad 300 is to be soldered to pad 412*a*, spacer feature 310 comes into contact with pad 412*a* and, hence, height 'x' 508 effectively determines the thickness of a layer of solder material that is formed between contact pad 300 and pad 412*a*. Since the thickness of a layer of solder material, e.g., layer 420*a* of FIG. 4, is typically between approximately 0.002 inches and approximately 0.003 inches, height 'x' 508 may be between approximately 0.002 inches and approximately 0.003 inches.

As will be appreciated by those skilled in the art, when the thickness of a layer of solder material is relatively small, e.g., less than approximately 0.001 inches, the strength of the joint formed between contact pad 300 and pad 412*a* maybe less than acceptable. Alternatively, when the thickness of the layer of solder material is relatively large, then the likelihood that contact pad 300, or a contact pad (not shown) associated with contact pad 300, may effectively be an open pin is increased. Therefore, although height 'x' 508 may vary widely, in order to effectively ensure that a product or device which includes contact pad 300 is reliable, height 'x' 508 is generally no less than approximately 0.001 inches and no more than approximately 0.003 inches.

Figure 6:
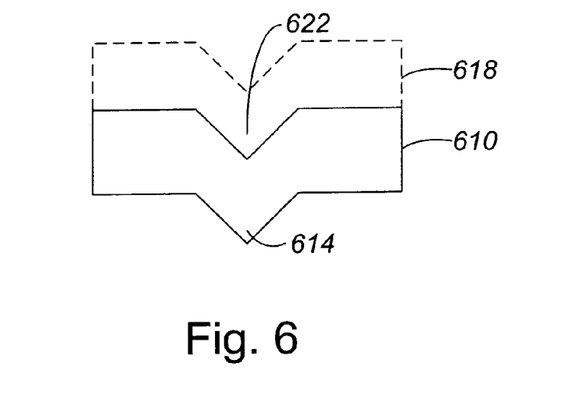
FIG. 6 is a diagrammatic representation of a pad with a spacer feature in accordance with a second embodiment of the present invention.

In order to form contact pad 300 with spacer feature 310, contact material may be etched, i.e., etched such that spacer feature 310 is formed on contact pad 300, and plated. While etching is one suitable method for forming contact pad 300, other methods may also be used to form contract pad 300. By way of example, a stamping process may be used to stamp contact pad 300 from a sheet of contact material. When a stamping process is used, a plurality of contact pads 300 may be stamped from a sheet of contact material in a manner that effectively optimizes the output from a single sheet of contact material. FIG. 6 is a diagrammatic representation of a contact pad which includes a spacer feature and is shaped such that the outline of at least one side of the contact pad is shared with another contact pad in accordance with a second embodiment of the present invention. A contact pad 610 includes a spacer feature 614. When contact pad 610 is to be stamped from a sheet of contact material, contact pad 610 may be arranged such that a second contact pad 618 shares a common side with contact pad 610. As shown, a spacer feature 622 of second contact pad 618 is arranged to substantially fit into an indentation associated with contact pad 610. Since second contact pad 618 abuts contact pad 610, the use of contact material is effectively economized. Further, a stamping process may be more efficient when contact pad 610 shares a common side with second contact pad 618. Once contact pads 610, 618 are stamped out, contact pads 610. 618 maybe subjected to a plating process, e.g., a process which plates contact pads 610, 618 with gold.

Figure 7A:
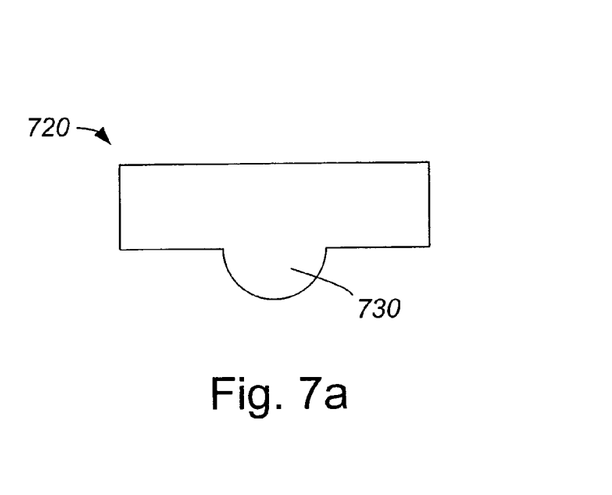
FIG. 7*a* is a diagrammatic representation of a pad with a spacer feature in accordance with a third embodiment of the present invention.
Figure 7B:
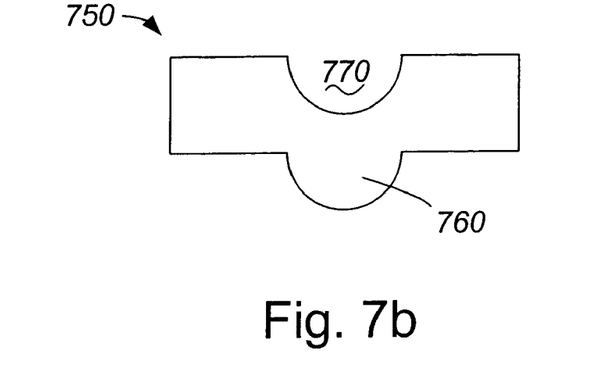
FIG. 7b is a diagrammatic representation of a pad with a spacer feature in accordance with a fourth embodiment of the present invention.

The overall shape of a contact pad or, more specifically, a spacer feature of the contact pad, may vary widely. The variance in the overall configuration of a contact pad may be due, at least in part, to manufacturing considerations which include, but are not limited to, the ease with which a contact pad of a particular shape may be formed and the amount of material needed to form a contact pad of a given shape. In one embodiment, a spacer feature of a contact pad may have a slightly rounded edge that enables a contact area of the spacer feature to be relatively smooth. FIGS. 7*a* and 7*b* are diagrammatic representations of contact pads with rounded spacer features in accordance with an embodiment of the present invention. A contact pad 720 of FIG. 7*a* includes a rounded spacer feature 730, while a contact pad 750 of FIG. 7*b* includes a rounded spacer feature 760 and a rounded indentation 770. While both contact pads 720, 750 may be formed using an etching process, contact pad 750 is also shaped such that if contact pad 750 is formed using a stamping process, a spacer feature of an adjacent contact pad (not shown) maybe formed essentially from material removed from indentation 770.

Figure 8A:
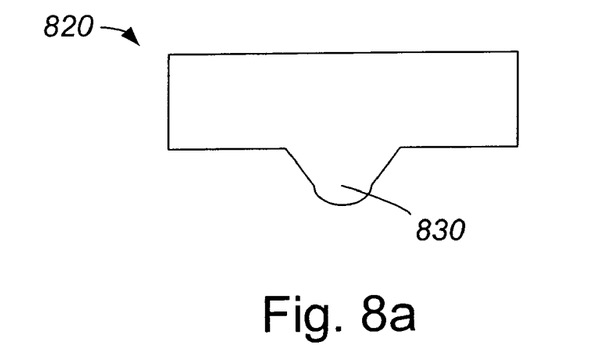
FIG. 8a is a diagrammatic representation of a pad with a spacer feature in accordance with a fifth embodiment of the present invention.
Figure 8B:
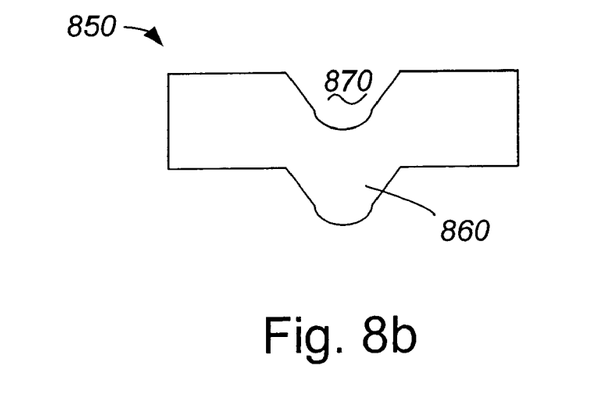
FIG. 8b is a diagrammatic representation of a pad with a spacer feature in accordance with a sixth embodiment of the present invention.

FIGS. 8*a* and 8*b* are diagrammatic representations of contact pads with rounded spacer features in accordance with another embodiment of the present invention. A contact pad 820 of FIG. 8*a* includes a spacer feature 830 with a substantially rounded tip, while a contact pad 850 of FIG. 8*b* includes a spacer feature 860 with a substantially rounded tip and a correspondingly shaped indentation 870. Contact pads 820, 850 may be formed using an etching process. Although contact pads 820, 850 may both be formed using a stamping process, contact pad 850 is particularly well suited to being formed using a stamping process, as contact pad 850 includes indentation 870 which is shaped such that a spacer feature of an adjacent contact pad (not shown) may be formed essentially from material removed from indentation 870.

Figure 9A:
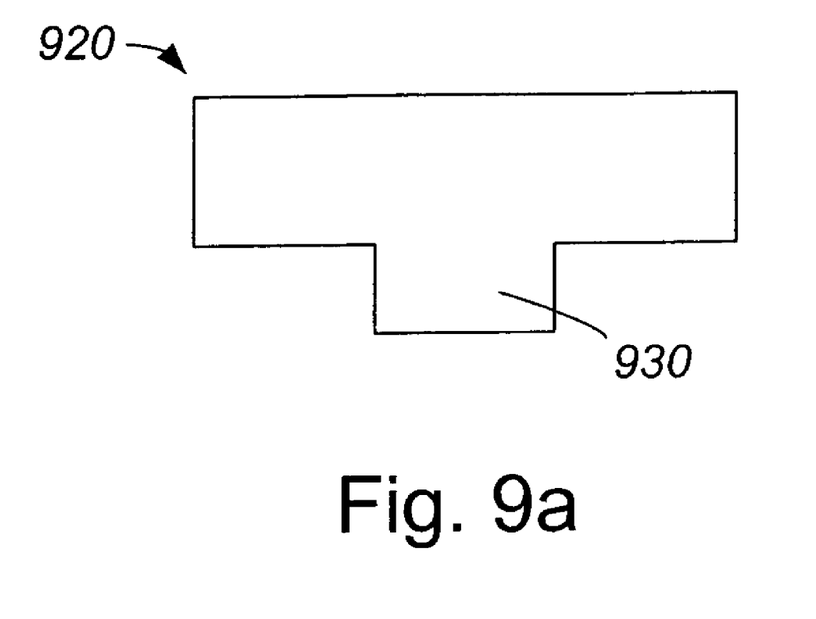
FIG. 9a is a diagrammatic representation of a pad with a spacer feature in accordance with a seventh embodiment of the present invention.
Figure 9B:
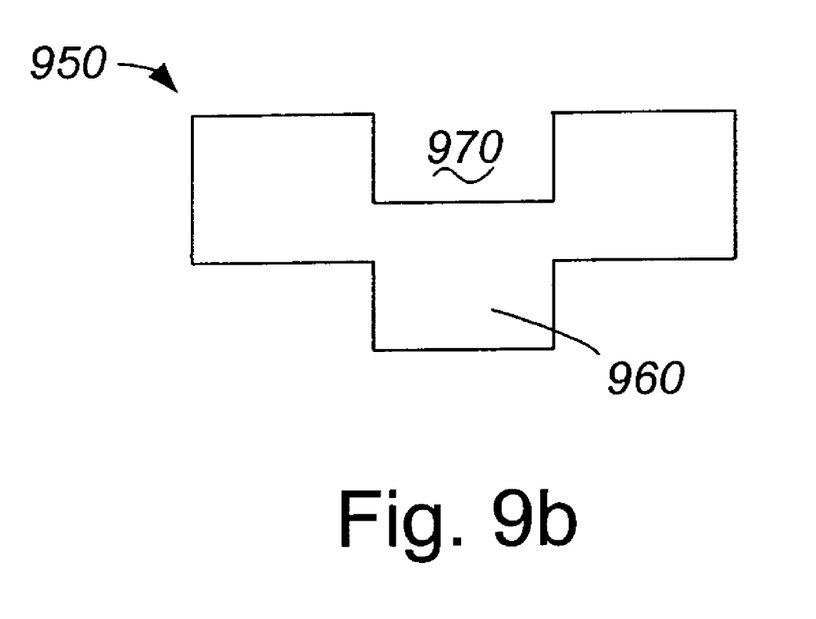
FIG. 9b is a diagrammatic representation of a pad with a spacer feature in accordance with an eighth embodiment of the present invention.

Although a relatively small percentage of a contact pad, e.g., less than approximately five percent, is typically arranged to come into contact with another contact pad during a soldering process, it may sometimes be desirable to have a larger percentage of the contact pad in contact with another contact pad. When a larger percentage of a contact pad associated with a component is to come into contact with a contact pad associated with a circuit board, then a spacer feature associated with the contact pad of the component may be shaped to have a more substantial contact area. FIGS. 9*a* and 9*b* are diagrammatic representations of contact pads with spacer features which have a relatively substantial contact area in accordance with an embodiment of the present invention. As shown, contact pads 920, 950 include substantially squared spacer features 930, 960, respectively. Spacer features 930, 960 are arranged such that a bottom portion of spacer features 930, 960 contact a contact pad of a circuit board. Contact pad 950 also includes an indentation 970 which may be arranged to facilitate a stamping process performed to stamp contact pad 950 out of a sheet of contact material.

The use of contact pads with spacers is generally applicable in substantially any system in which contact pads or leads are to be soldered onto a surface, e.g., another contact pad or another lead. In one embodiment, as described above, contact pads with spacer features may be incorporated onto a semiconductor package which is to be coupled to a printed circuit board. As will be appreciated by those skilled in the art, many devices, e.g., electronic devices and memory devices, utilize circuit boards onto which various components are soldered. One example of a device which may include components that utilize contact pads with spacer features is a non-volatile memory device such as a flash memory card. A flash memory card may include a circuit board onto which a controller or a flash memory chip, either or both of which may include contact pads with spacer features, may be soldered.

Figure 10:
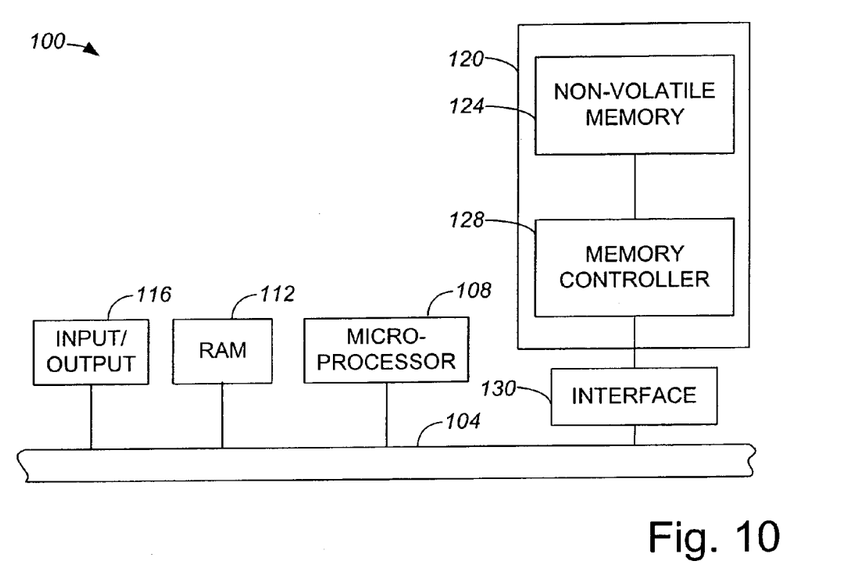
FIG. 10 is a diagrammatic representation of a general host system which includes a non-volatile memory device in accordance with an embodiment of the present invention.

In general, when a non-volatile memory device, e.g., a memory card that includes contact pads with spacer features, is interfaced within a host system, the host system may communicate with the non-volatile memory device to cause bits to be written to, read from, or erased within the non-volatile memory device. Referring initially to FIG. 10, a general host system that includes a non-volatile memory device, e.g., a CompactFlash memory card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and a networking device, which are not shown for purposes of illustration.

Host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, a video player, or a computer system. It should be appreciated, however, that host system 100 may generally be substantially any system which stores data or information, and retrieves data or information.

Host system 100 may also be a system that either only captures data, or only retrieves data. That is, host system 100 maybe a dedicated system which stores data, or host system 100 may be a dedicated system which reads data. By way of example, host system 100 may be a memory writer which is arranged substantially only to write or store data. Alternatively, host system 100 may be a device such as an MP3 player which is typically arranged to read or retrieve data, but not to capture data.

A non-volatile memory device 120, in one embodiment, is a removable non-volatile memory device that is typically arranged to interface with bus 104 to store information through an input/output circuit interface 130. Input/output interface 130, which is typically a reader or an adapter, may serve to reduce loading on bus 104, as will be understood by those skilled in the art. Non-volatile memory device 120 includes non-volatile memory 124 and a memory control system 128. In one embodiment, non-volatile memory device 120 may be implemented on a single chip or a die, e.g., a single chip which may include contact pads with spacers. Alternatively, non-volatile memory device 120 may be implemented on a multi-chip module, or on multiple discrete components which may be used together as non-volatile memory device 120. One embodiment of non-volatile memory device 120 will be described below in more detail with respect to FIG. 11.

Non-volatile memory 124 is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128.

Non-volatile memory device 120 has generally been described as including a memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art.

Figure 11:
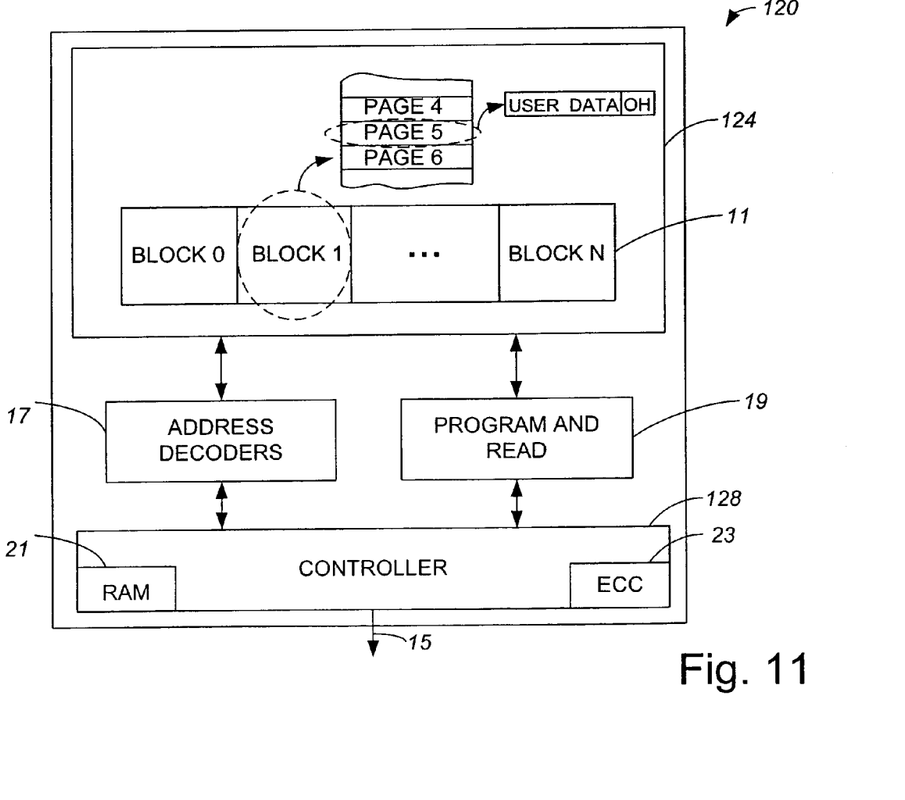
FIG. 11 is a diagrammatic representation of a non-volatile memory device, i.e., non-volatile memory device 120 of FIG. 10, in accordance with an embodiment of the present invention.

With reference to FIG. 11, non-volatile memory device 120 will be described in more detail in accordance with an embodiment of the present invention. As described above, non-volatile memory device 120 includes non-volatile memory 124 and memory control system 128. Memory 124 and control system 128, or controller, are primary components of non-volatile memory device 120. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

Control system 128 communicates over a bus 15 to a host computer or other system that is using the memory system to store data. Bus 15 is generally a part of bus 104 of FIG. 10. Control system 128 also controls operation of memory 124, which may include a memory cell array 11, to write data provided by the host, read data requested by the host and perform various housekeeping functions in operating memory 124. Control system 128 generally includes a general-purpose microprocessor which has associated non-volatile software memory, various logic circuits, and the like. One or more state machines are often also included for controlling the performance of specific routines.

Memory cell array 11 is typically addressed by control system 128 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Array 11 is divided into a large number of BLOCKS 0–N of memory cells. As is common for flash EEPROM systems, the block is the unit of erase. That is, each block contains the minimum number of memory cells that are erased together. Each block is typically divided into a number of pages, as also illustrated in FIG. 10. A page is the unit of programming. That is, a basic programming operation writes data into a minimum of one page of cells. One or more sectors of data are typically stored within each page. As shown in FIG. 11, one sector includes user data and overhead data. Overhead data typically includes an error correction code (ECC) that has been calculated from the user data of the sector. A portion 23 of the control system 128 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data is typically an additional 28 bytes. One sector of data is most commonly included in each page but two or more sectors may instead form a page. A large number of pages form a block, anywhere from eight pages, for example, up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Although only a few embodiments of the present invention have been described, it should be understood that the present invention may be embodied in many other specific forms without departing from the spirit or the scope of the present invention. By way of example, while a flash memory card has generally been described as including components or packages which have contact pads with spacer features, components or packages which have contact pads with spacer features may be used in a variety of different systems. It should be understood that contact pads with spacer features may be incorporated in substantially any application in which the spacing between contact pads joined by a solder joint, i.e., the thickness of a solder joint, is to be controlled or is critical.

The dimensions associated with a spacer feature have been described as including a height that is substantially equal to the desired thickness of a layer of solder material and a contact surface which has an area that is less than or approximately equal to a predetermined percentage of the overall area of a contact pad. It should be appreciated, however, that the dimensions associated with a spacer feature may be widely varied.

While spacer features have generally been described as being included on contact pads associated with components such as semiconductor packages, dies, or silicon chips, the spacer features may also be located on contact pads associated with printed circuit boards. In other words, printed circuit boards may be formed with pads or leads which include spacer features. Such printed circuit boards may be interfaced or bonded with components which have conventional pads to effectively control the spacing between the pads of the circuit boards and the pads of the components using the spacer features associated with the printed circuit boards.

Further, contact pads with spacer features may generally be included on substantially any substrate, e.g., semiconductor package or circuit board, that is to be interfaced with or bonded with another substrate. For instance, a semiconductor package or a silicon chip which includes contact pads with spacer features may be interfaced with another, e.g., a larger, semiconductor package.

In general, a semiconductor package or chip which includes contact pads with spacer features may have a plurality of contact pads with spacer features which are each of a particular size. That is, substantially all contact pads associated with a particular semiconductor package may include the same spacer features. In one embodiment, however, a particular semiconductor package may include contact pads with different spacer features without departing from the spirit or the scope of the present invention.

Contact pads with spacer features may be incorporated into a package which is to be snapped into a carrier. In other words, spacer features may be used to provide a reliable point contact between a package and a carrier into which the package is to be incorporated. By way of example, a carrier may be arranged to accept a memory component by being configured to include a receptacle for the memory component. When either the carrier, e.g., a carrier associated with an elastomeric surface, or the memory component includes a contact pad with a spacer feature, once the memory component is snapped into the carrier, the spacer feature effectively promotes a reliable point contact between the contact pad of the memory component and a contact pad of the carrier. The reliable point contact may be achieved when the spacer feature comes into contact with a portion of the contact pad of the carrier, even when the contact pad with the spacer feature is not arranged to be soldered to the contact pad of the carrier. Therefore, the present examples are to be considered as illustrative and not restrictive, and the invention is not to be limited to the details given herein, but may be modified within the scope of the appended claims.

What is claimed is:

1. An assembly comprising:
a printed circuit, the printed circuit including a first electrical contact, the first electrical contact having a contact surface;
a package, the package including a second electrical contact, the second electrical contact having a principal contact portion and a spacer portion, wherein the spacer portion is arranged to interface with the contact surface of the first electrical contact to maintain a space between the contact surface of the first electrical contact and the principal contact portion of the second electrical contact; and
solder that fills the space maintained by the spacer portion between the contact surface of the first electrical contact and the principal contact portion of the second electrical contact,
wherein the distance between the contact surface of the first electrical contact and the principal contact portion of the second electrical contact is between approximately 0.002 inches and approximately 0.003 inches.

2. The assembly of claim 1 wherein a thickness of the layer of solder material is substantially defined by a height of the spacer portion.

3. A method of adhering a semiconductor package having a first set of contact pads to an object having a second set of contact pads, the method comprising:
forming the first set of contact pads such that each pad of the set comprises a principal soldering area and a spacer, the spacer formed by etching and/or stamping the principal soldering area;
creating a void of a preselected height between the principal soldering area of each of the first set of contact pads and each of the second set of contact pads by placing the spacer of each contact pad of the first set of contact pads in contact with a contact pad of the second set of contact pads; and
filling each void with solder such that the height of each void is filled with solder and the first and second set of contact pads are in electrical contact.

4. The method of claim 3 wherein the void has a substantially uniform height except in a region above or below each spacer of the first set of contact pads.

5. A method of adhering a semiconductor package having a first set of contact pads to an object having a second set of contact pads, the method comprising:
forming the first set of contact pads such that each pad of the set comprises a principal soldering area and a spacer,
creating a void of a preselected height between the principal soldering area of each of the first set of contact pads and each of the second set of contact pads by placing the spacer of each contact pad of the first set of contact pads in contact with a contact pad of the second set of contact pads; and
filling each void with solder such that the height of each void is filled with solder and the first and second set of contact pads are in electrical contact,
wherein the height of the void is between approximately 0.002 inches and approximately 0.003 inches, except in the area of the spacer.

* * * * *